United States Patent
Sasaki (10) Patent No.: US 9,396,945 B2
(45) Date of Patent: Jul. 19, 2016

(54) METHOD FOR PRODUCING SIC SUBSTRATE

(71) Applicant: SHOWA DENKO K.K., Tokyo (JP)

(72) Inventor: Yuzo Sasaki, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/898,501

(22) PCT Filed: Jun. 17, 2014

(86) PCT No.: PCT/JP2014/065996
§ 371 (c)(1),
(2) Date: Dec. 15, 2015

(87) PCT Pub. No.: WO2014/208400
PCT Pub. Date: Dec. 31, 2014

(65) Prior Publication Data
US 2016/0133465 A1  May 12, 2016

(30) Foreign Application Priority Data

Jun. 24, 2013  (JP) .................. 2013-131717

(51) Int. Cl.
| | | |
|---|---|---|
| H01L 21/302 | (2006.01) | |
| H01L 21/461 | (2006.01) | |
| H01L 21/04 | (2006.01) | |
| H01L 21/306 | (2006.01) | |
| H01L 21/02 | (2006.01) | |

(52) U.S. Cl.
CPC ...... *H01L 21/0475* (2013.01); *H01L 21/02013* (2013.01); *H01L 21/30625* (2013.01)

(58) Field of Classification Search
CPC .............. H01L 21/0475; H01L 21/02013; H01L 21/30625
USPC .......................................... 438/693
See application file for complete search history.

(56) References Cited

U.S. PATENT DOCUMENTS

| | | |
|---|---|---|
| 2008/0173843 A1 | 7/2008 | Hotta et al. |
| 2010/0092366 A1 | 4/2010 | Kogoi et al. |

FOREIGN PATENT DOCUMENTS

| | | |
|---|---|---|
| JP | 2002-43570 A | 2/2002 |
| JP | 2008-166329 A | 7/2008 |
| JP | 2008-179655 A | 8/2008 |
| JP | 2009-10071 A | 1/2009 |
| JP | 2009-238891 A | 10/2009 |
| JP | 2010-284784 A | 12/2010 |
| JP | 2011-513991 A | 4/2011 |
| WO | 2009/111001 A2 | 9/2009 |

OTHER PUBLICATIONS

International Search Report for PCT/JP2014/065996 dated Sep. 2, 2014.

*Primary Examiner* — Roberts Culbert
(74) *Attorney, Agent, or Firm* — Sughrue Mion, PLLC (57) ABSTRACT

A method that includes at least a CMP step of subjecting both a Si surface (1a) and a C surface (1b) of an SiC substrate (1) to double-sided polishing using a CMP (Chemical Mechanical Polishing) method with a C surface/Si surface processing selectivity ratio of 3.0 or greater.

7 Claims, 6 Drawing Sheets

|  | 0.3 TO 10 μm DEFECTS (counts/pl) | 10 TO 30 μm DEFECTS (counts/pl) | 30 μm OR LARGER DEFECTS (counts/pl) |
|---|---|---|---|
| AFTER CMP | 0 | 0 | 0 |
| AFTER EPITAXIAL LAYER GROWTH (ABOUT 30 μm) | 17308 | 133 | 105 |
| AFTER POLISHING OF EPITAXIAL SURFACE | 296 | 89 | 51 |

METHOD FOR PRODUCING SIC SUBSTRATE

CROSS REFERENCE TO RELATED APPLICATIONS

This application is a National Stage of International Application No. PCT/JP2014/065996 filed Jun. 17, 2014, claiming priority based on Japanese Patent Application No. 2013-131717 filed Jun. 24, 2013, the contents of all of which are incorporated herein by reference in their entirety.

TECHNICAL FIELD

The present invention relates to a method for producing an SiC substrate, and relates particularly to a method for producing an SiC substrate that has a step for polishing and planarizing the surfaces of the SiC substrate.

BACKGROUND ART

Compared with silicon (Si), silicon carbide (SiC) has properties which include an insulation breakdown electric field that is an order of magnitude greater, a band gap that is 3 times greater and a thermal conductivity that is about 3 times higher, and therefore holds considerable promise for applications to power devices, high-frequency devices, and high-temperature operation devices and the like. As a result, in recent years, SiC substrates are increasingly being used as substrates of semiconductor devices.

The SiC substrates described above are produced, for example, from bulk single crystal ingots of SiC prepared by a sublimation method or the like. Usually, the outer periphery of the ingot is ground and processed into a cylindrical shape, a wire saw or the like is then used to slice the cylindrical shape into circular discs, and the external periphery is then chamfered to a prescribed diameter to obtain the substrate. Moreover, the surfaces of the circular disc-shaped SiC substrate are subjected to a grinding treatment using a mechanical grinding method to remove unevenness and achieve parallelism of the surfaces. Subsequently, one surface or both surfaces of the substrate are provided with a mirror finish by subjecting the surface(s) to mechanochemical polishing such as CMP (Chemical Mechanical Polishing). This type of grinding and polishing of the SiC substrate is performed for purposes such as removing undulations and process distortions generated by the slicing process, and planarizing the surface of the SiC substrate.

The type of CMP method mentioned above is a polishing method that has both a chemical action and a mechanical action, and therefore a planar surface can be obtained in a stable manner, without damaging the SiC substrate. As a result, CMP methods are widely employed in production processes for SiC semiconductor devices and the like, as a method for planarizing either roughness or undulations that have been generated on the surface of the SiC substrate, or planarizing unevenness due to wiring or the like on a wafer obtained by stacking an epitaxial layer on the surface of the SiC substrate.

SiC (epitaxial) wafers obtained using an SiC substrate are usually produced by using a chemical vapor deposition (CVD) method to grow an SiC epitaxial film (epitaxial layer) that functions as an active region of the SiC semiconductor device on an SiC substrate obtained using the procedure outlined above. On the other hand, if an SiC substrate that has been sliced from an SiC single crystal ingot is used in an unmodified state, with unevenness or undulations on the substrate surface, then the surface of the epitaxial layer deposited on the surface of the SiC substrate may sometimes also develop unevenness or the like. Then, when producing an SiC wafer by growing an SiC epitaxial layer on an SiC substrate, the surface of the SiC substrate should first be polished using a CMP method, before the SiC epitaxial layer is grown on the surface of the substrate. Following growth of the SiC epitaxial layer, a roughness removal treatment or planarization treatment for the surface of the SiC wafer is conducted by performing a grinding treatment using a mechanical grinding method and a finishing polishing treatment using a CMP method in a similar manner to that described above.

If semiconductor elements such as transistors or diodes are formed on the surface of the epitaxial layer on the SiC substrate to produce a semiconductor device while undulations or process distortions still remain on the substrate surface, then it becomes difficult to obtain the types of electrical characteristics that are expected based on the superior physical properties inherent to the SiC. Accordingly, the aforementioned type of planarization treatment used for the surface of an SiC substrate containing an epitaxial layer is an extremely important process.

Generally, a mechanical polishing method such as lap polishing is effective as a treatment for removing undulations or process distortions from the surface of an SiC substrate. In terms of surface planarization, polishing using diamond having a particle size of not more than 1 µm, or grinding using a whetstone having a high grit size of at least #10,000 is effective. Moreover, in terms of finishing processing on an SiC substrate surface prior to growing an SiC epitaxial film (epitaxial layer), or finishing processing on a wafer following growth of an SiC epitaxial layer, a polishing process using a CMP method is generally performed to reduce the surface roughness Ra to a value of less than 0.1 µm.

A method for polishing the surface of an SiC substrate using a CMP method is described below using FIG. 6.

Figure 6:
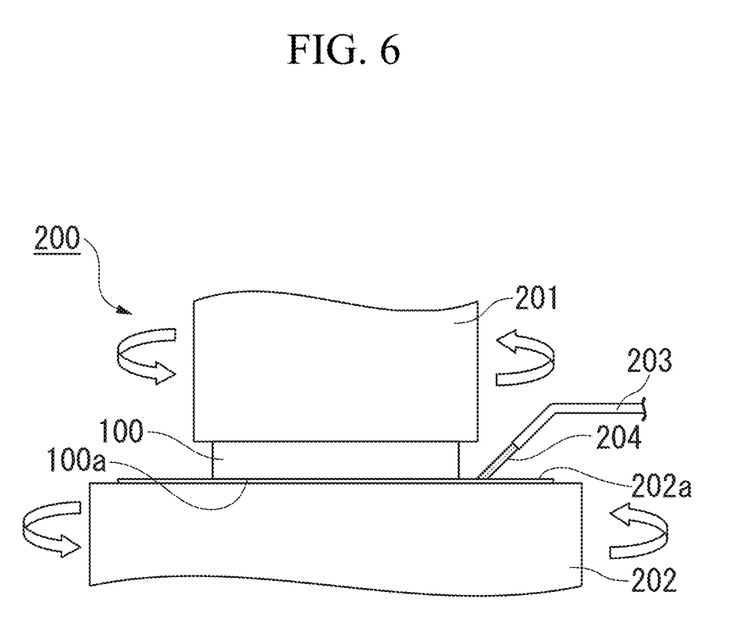
FIG. 6 is a diagram schematically describing a conventional method for producing an SiC substrate.

As illustrated in FIG. 6, an SiC substrate 100 that has been sliced from an ingot and then subjected to surface grinding using a mechanical grinding method is mounted on a rotatable SiC substrate support portion 201 provided in a CMP polishing apparatus 200. Then, the SiC substrate 100 is pressed against a polishing pad 202a affixed to the surface of a rotating surface plate 202. Further, at the same time, the SiC substrate support portion 201 is rotated while a slurry 204 is supplied from a slurry tube 203 to the interface between the polishing pad 202a and the SiC substrate 100. As a result, the polishing surface (upper surface) 100a of the SiC substrate 100 can be polished.

Generally, when an epitaxial layer is deposited on the Si surface that represents the deposition surface of the SiC substrate, surface roughness that develops on the surface of the layer is a problem, and particularly when the thickness of the epitaxial layer is increased, the roughness of the layer surface becomes quite noticeable. This is mainly due to roughness that occurs as a result of step bunching when the epitaxial layer is grown thickly.

Figure 5A:
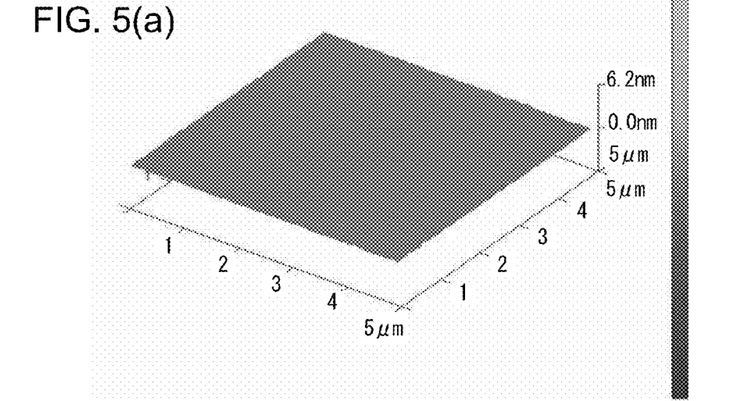
FIG. 5(a) shows the Si surface of the SiC substrate following CMP polishing using a slurry containing a colloidal silica.
Figure 5B:
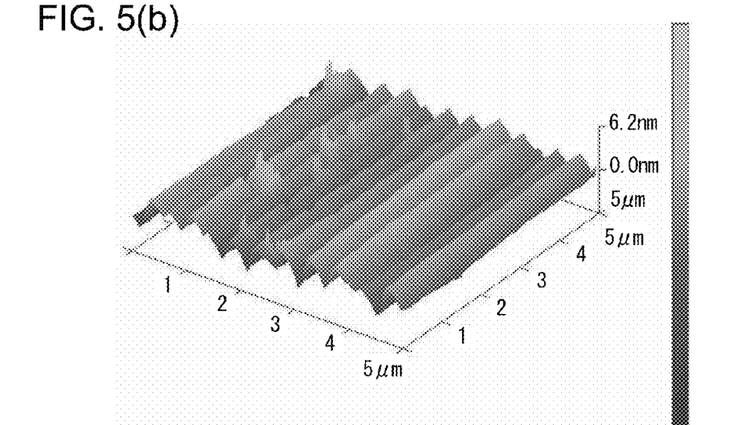
FIG. 5(b) shows the surface of the epitaxial layer immediately following deposition of the epitaxial layer on the Si surface.

For example, as illustrated in FIG. 5(*a*), prior to deposition of the epitaxial layer, because the SiC substrate has been subjected to polishing using a CMP method, almost no surface roughness is visible, and even in an evaluation using AFM imaging, almost no unevenness or defects can be detected. However, as illustrated in FIG. 5(*b*), if a thick epitaxial layer of about 30 µm is deposited on the SiC substrate, then a state of roughness develops across the entire layer surface, step bunching can also be detected in the AFM evaluation, and large epitaxial defects in the order of several tens of µm also tend to occur readily.

Figure 5C:
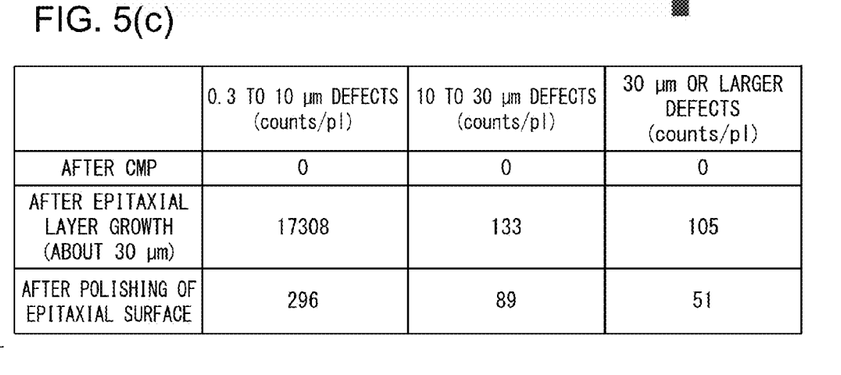
FIG. 5(c) shows the number of counts for different defect sizes determined by a Candela evaluation across the entire surface of the substrate, immediately following CMP polishing, following deposition of the epitaxial layer, and following CMP polishing of the surface of the epitaxial layer.

On the other hand, roughness that occurs due to the type of step bunching described above has a height of about 0.01 μm in the layer thickness direction. Consequently, as illustrated in FIG. 5(c), by subjecting the surface of the epitaxial layer on which roughness has developed to CMP processing using a removal amount of about 1 μm, the roughness due to step bunching and the like can be removed. In other words, provided the roughness on the epitaxial layer surface can be removed using the type of method described above, a large layer thickness that is suitable as the epitaxial layer for a high-pressure resistant device can be maintained, and an SIC epitaxial substrate having minimal roughness can be formed. This offers the advantage that devices having excellent element characteristics can be produced in subsequent device formation steps. In other words, finish polishing of the epitaxial layer surface is an extremely important process.

Examples of the aforementioned type of method for polishing an SiC substrate surface using a CMP method with the purpose of removing the surface roughness from an epitaxial layer deposited on the SiC substrate include the type of method proposed in Patent Document 1. Patent Document 1 discloses a method in which a plurality of SiC substrates are mounted on a rotating table, and CMP polishing is then performed using a batch treatment.

Patent Document 2 discloses a method for forming a channel region in a production process for a semiconductor device, wherein the channel region is formed by polishing and planarizing an epitaxial layer.

PRIOR ART LITERATURE

Patent Documents

Patent Document 1: Japanese Unexamined Patent Application, First Publication No. 2009-10071
Patent Document 2: Japanese Unexamined Patent Application, First Publication No. 2002-43570

DISCLOSURE OF INVENTION

Problems to be Solved by the Invention

In the aforementioned SiC substrate, roughness such as clouding of the substrate surface may sometimes occur not only at the deposition surface (Si surface), but also at the C surface that represents the back surface, in a similar manner to that observed for the epitaxial layer on the Si Surface, depending on the epitaxial growth conditions at the Si surface side. Examples of these epitaxial growth conditions at the Si surface side include the type of growth furnace used and the deposition temperature.

Figure 7A:
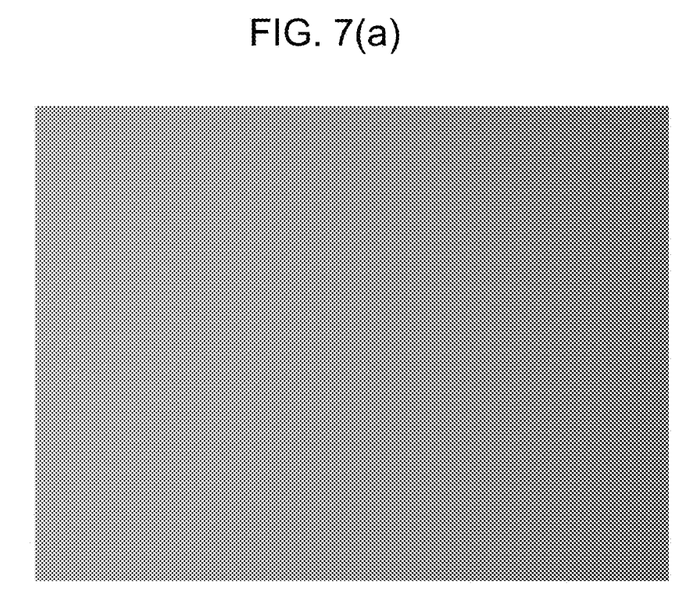
FIG. 7(a) is a microscope photograph showing the surface of the C layer before the formation of the epitaxial layer on the Si surface.
Figure 7B:
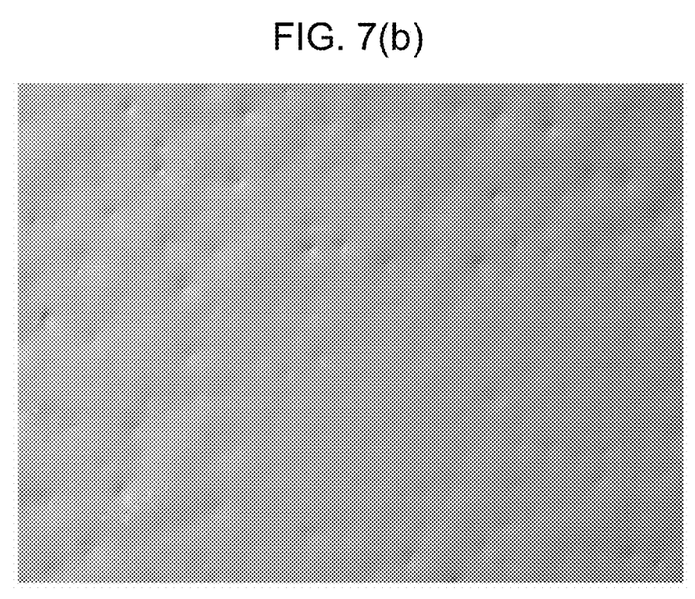
FIG. 7(b) is a microscope photograph showing the surface of the C layer after the formation of the epitaxial layer on the Si surface.

For example, as illustrated in the microscope photograph of FIG. 7(a), prior to deposition of an epitaxial layer on the Si surface of the SiC substrate, the C surface that represents the back surface of the substrate is polished to a mirror surface by diamond polishing or the like. In contrast, as illustrated in FIG. 7(b), following deposition of the epitaxial layer, a state of roughness has developed. Reasons for the development of this type of roughness are thought to include transfer from the SiC members that constitute the apparatus, and carbon elimination from the SiC substrate. When the deposition temperature is a high temperature of about 1,500° C., almost all of the materials sublimate, and therefore it is thought that roughness on the C surface may also develop due to gases of the sublimated materials flowing around to the back side of the substrate.

In this manner, when roughness develops on the C surface, in a similar manner to that observed for roughness on the Si surface, if the C surface is also subjected to polishing after the deposition of the epitaxial layer on the Si surface of the SiC substrate, then the roughness on the C surface can be removed. If the roughness that has developed on the C surface of the SiC substrate can be removed, then other effects such as a suppression of suction error of the SiC substrate in subsequent evaluation processes can also be obtained, and hence polishing of the C surface is very important.

On the other hand, following deposition of the epitaxial layer on the Si surface, if the two surfaces of the SiC substrate, namely the Si surface on which the epitaxial layer has been deposited and the C surface that represents the back surface are polished in separate steps, then the increase in the number of steps hinders any attempt to improve the productivity and tends to cause increased costs. As a result, in those cases where a polishing step for the C surface is to be performed in addition to the polishing of the epitaxial layer deposited on the Si surface of the SiC substrate, it is desirable that both surfaces are polished simultaneously.

However, if double-sided polishing of both the Si surface and the C surface of an SiC substrate is performed via a conventionally employed CMP polishing process using a slurry containing an abrasive such as a colloidal silica, then the processing rate of the Si surface by the slurry containing the colloidal silica is inherently slow. Further, if the processing rate for the Si surface is optimized, then the processing rate for the C surface may sometimes deteriorate dramatically. Accordingly, even if the balance between the processing rates for the two surfaces is adjusted, because the absolute values for the rates are low, the processing time required to remove the roughness caused by epitaxial growth tends to be long.

Generally, because the height dimension of the step bunching that occurs during epitaxial growth is not particularly large, the polishing rate for the Si surface need not be particularly high. Despite this, if double-sided polishing of the SiC substrate is performed using a diamond slurry, then the epitaxial layer on the Si surface is ground down significantly. As a result, producing an SiC wafer for a high-pressure resistant device that requires a large layer thickness has proven extremely difficult.

As outlined above, conventionally, no proposals have been made regarding techniques for performing double-sided polishing of the Si surface and the C surface of an SiC substrate by CMP polishing in which both the Si surface and the C surface can be polished at an appropriate polishing rate, without excessive removal of the epitaxial layer. Consequently, a polishing method which enables removal of the roughness from the epitaxial layer while maintaining a large layer thickness, and also enables reliable removal of roughness from the C surface on the back surface has been keenly sought.

The present invention has been developed in light of the above circumstances, and has an object of providing a method for producing an SiC substrate that provides excellent productivity and yield, Wherein even when double-sided polishing is performed using a CMP method, the roughness on the surface of the epitaxial layer can be removed without excessive removal of the epitaxial layer on the Si surface, and the roughness on the C surface can also be removed effectively.

Means for Solving the Problems

The inventors of the present invention conducted intensive research aimed at developing a method which, when double-sided polishing of the Si surface and the C surface of an SiC substrate such as that described above was performed using a CMP method, enabled roughness derived from step bunching and the like to be removed while preventing excessive removal of the epitaxial layer formed on the Si surface, thus ensuring that at least a certain thickness was maintained, and also enabled the C surface on the back side of the substrate to be polished at a prescribed rate or higher, thus enabling removal of roughness on the C surface. As a result of these investigations, they discovered that by using an ultra high rate CMP slurry for the Si surface, preferably containing potassium permanganate as an oxidant and preferably containing alumina as an abrasive, and also adopting conditions that yielded a high selectivity for the C surface, the roughness on the surface of the epitaxial layer could be removed while suppressing the amount of the epitaxial layer removed to a minimum, and the roughness on the C surface could also be removed. In other words, the inventors discovered that by performing double-sided polishing of an SiC substrate with certain CMP polishing conditions such as the type of slurry and the C surface/Si surface processing selectivity ratio set within appropriate ranges, the roughness could be removed reliably from both the Si surface (the epitaxial layer) and the C surface via a simple process, with no loss of productivity and with good maintenance of a large layer thickness for the epitaxial layer, and the planarity of the epitaxial layer surface could also be improved, and they were thus able to complete the present invention.

In other words, in order to achieve the object described above, the present invention provides the aspects described below.

(1) A method for producing an SiC substrate that includes a step of polishing the surfaces of the SiC substrate, wherein the method is provided with at least a CMP step of subjecting both the Si surface and the C surface of the SIC substrate to double-sided polishing using a CMP (Chemical Mechanical Polishing) method with a C surface/Si surface processing selectivity ratio of 3.0 or greater.

(2) The method for producing an SiC substrate disclosed in (1), wherein the SiC substrate is an SiC substrate prepared by stacking an epitaxial layer on the Si surface side of the substrate.

(3) The method for producing an SiC substrate disclosed in (1) or (2), wherein the CMP step uses a potassium permanganate-based slurry containing potassium permanganate as an oxidant and having a pH of 2 to 6.

(4) The method for producing an SiC substrate disclosed in (3), wherein the CMP step uses, as the potassium permanganate-based slurry, a slurry containing alumina as an abrasive.

(5) The method for producing an SIC substrate disclosed in any one of (1) to (4), wherein in the CMP step, the polishing load with which a polishing pad is pressed against the SiC substrate is within a range from 100 to 500 (g/cm$^2$).

(6) The method for producing an SiC substrate disclosed in any one of (1) to (5), wherein in the CMP step, the polishing rate of the Si surface of the SiC substrate is from 0.5 to 3.0 (μm/hr), and the polishing rate of the C surface is from 3 to 15 (μm/hr).

(7) The method for producing an SiC substrate disclosed in any one of (1) to (6), further including, prior to the CMP step, a rough polishing step of polishing the Si surface and the C surface of the SiC substrate using a mechanical polishing method.

In the present invention, the term "SiC substrate" includes both SiC substrates in which an epitaxial layer has been stacked on at least one surface of the substrate (namely, an SiC epitaxial wafer), and SiC substrates themselves. In other words, in the present invention, the expression "planarize the surface of an SiC substrate by polishing" includes both the case in which an SiC substrate having an epitaxial layer stacked on the Si surface (an SiC epitaxial wafer) is polished on both surfaces (the epitaxial layer surface and the C surface), and the case in which an SiC substrate itself is polished on both surfaces (the Si surface and the C surface).

Effects of the Invention

The method for producing an SiC substrate according to the present invention employs a method of performing double-side polishing of an SiC substrate having a Si surface and a C surface, by using a CMP method to polish both the Si surface and the C surface with a C surface/Si surface processing selectivity ratio that is at least as high as a prescribed value. In this manner, by performing double-sided polishing of the SIC substrate with the CMP polishing conditions set within appropriate ranges, roughness on the surface of the epitaxial layer deposited on the Si surface can be removed via a simple process. Further, the amount removed from the epitaxial layer can be suppressed to a minimum, and the roughness on the C surface can also be removed. Moreover, by processing both surfaces simultaneously, improvements can also be expected in the planarity, namely the GBIR (Global Back Ideal Range (TTV: Total Thickness Variation)) and the SBIR (Site Back Ideal Range ($LTV_{max}$: Local Thickness Variation)). Accordingly, an SiC substrate which has excellent surface properties and can be used for high-pressure resistant devices can be produced with good productivity and yield.

BRIEF DESCRIPTION OF THE DRAWINGS

FIGS. 1(a) and 1(b) are diagrams schematically describing the method for producing an SiC substrate according to an embodiment of the present invention, wherein

FIGS. 4(a) and 4(b) are diagrams schematically describing the method for producing an SiC substrate according to an embodiment of the present invention, and shows AFM measurement images (5 μm square field of view), wherein

FIGS. 5(a), 5(b) and 5(c) are diagrams schematically describing a conventional method for producing an SiC substrate, and shows AFM measurement images (5 μm square field of view) and a diagram illustrating a defect distribution on the SiC substrate determined by a Candela evaluation, wherein

FIGS. 7(a) and 7(b) are diagrams illustrating the state of the surface of the back side C layer before and after the formation of an epitaxial layer on the Si surface of an SiC substrate, wherein

BEST MODE FOR CARRYING OUT THE INVENTION

The method for producing an SiC substrate according to the present invention is described below in detail, mainly with appropriate references to FIG. 1(a), FIG. 1(b), FIG. 2, FIG. 3, FIG. 4(a) and FIG. 4(b) (but also with partial references to the conventional diagram of FIG. 6 and the microscope photographs of FIGS. 7(a) and 7(b)).

The drawings used in the following description may be drawn with specific portions enlarged as appropriate to facilitate comprehension of the drawing, and the dimensional ratios between the constituent elements may differ from the actual values. Further, the materials and dimensions and the like presented in the following examples are merely examples, which in no way limit the present invention, and may be altered as appropriate within the scope of the present invention.

<SiC Substrate>

The SiC substrate that represents the polishing target object in the method of the present invention is a semiconductor substrate that can be used in a wide variety of semiconductor devices, and has a Si surface on which an epitaxial layer is formed and a C surface on the back surface. This type of SiC substrate can be produced by first grinding the outer periphery of an SiC bulk single crystal ingot prepared by a sublimation method or the like to form a cylindrical shape, subsequently using a wire saw or the like to slice the cylindrical shape and form a circular disc, and then chamfering the external periphery of the circular disc to a prescribed diameter to obtain the substrate. Any of the poly type crystals may be used as the SiC bulk single crystal, and a 4H—SiC crystal, which is the type of SiC bulk single crystal mainly employed for fabricating practical SiC devices, can be used.

The surface of the sliced circular disc-shaped SiC substrate is mirror-polished in the final step, but first, a conventional mechanical polishing method is used to polish the surface, thereby removing most of the unevenness on the polished surface and adjusting the surface parallelism. Having undergone this surface polishing using a mechanical polishing method, the surface of the SiC substrate is then subjected to mechanochemical polishing using a CMP (Chemical Mechanical Polishing) method to obtain the finished SiC substrate having a surface with a mirror finish and a surface roughness Ra of not more than 0.1 (nm). At this time, only one surface of the SiC substrate, namely only the Si surface, need be polished to a mirror finish, but it is also possible to polish both the Si surface and the C surface to mirror surfaces.

By subjecting the SiC substrate to a surface polishing treatment, undulations and process distortions generated during the ingot slicing process described above are removed, and the surface of the substrate is planarized to form a mirror surface. This type of SiC substrate having a surface that has been polished to a mirror finish exhibits extremely superior planarity, and wafers prepared by forming any of various epitaxial layers on the SiC substrate exhibit excellent crystal properties for the deposited layers. The SiC substrate is usually used in the form of an SiC epitaxial wafer, prepared by forming an epitaxial layer that functions as an active region for an SIC device on the SiC substrate using a chemical vapor deposition (CVD) method or the like.

As mentioned above, the "SiC substrate" that represents the polishing target object in the present invention includes both an SiC substrate in which an epitaxial layer has been stacked on the Si surface (namely, an SiC epitaxial wafer), and an SiC substrate itself. Consequently, the polishing of an SiC substrate described in relation to the present embodiment includes not only the case in which an SiC substrate having an epitaxial layer stacked on the Si surface (an SiC epitaxial wafer) is polished on both surfaces (the Si surface and the C surface), but also the case in which an SiC substrate itself is polished on both surfaces. In the present embodiment, the case in which an SIC substrate having an epitaxial layer stacked on the Si surface is polished on both the Si surface (the surface of the epitaxial layer) and the C surface is described.

When the surface of an SiC substrate (SiC epitaxial wafer) such as that described above is polished, by removing unevenness such as very fine level differences and the like formed on the surface of the epitaxial layer during epitaxial growth, and planarizing the surface, roughness on the surface of the epitaxial layer is removed. By performing this type of polishing, the quality of the interface with the oxide layer formed on the epitaxial layer during formation of an electronic device is improved, meaning a high-quality device can be obtained. Particularly in those cases where the epitaxial growth layer is thick, such as an SiC substrate used in a high-pressure resistant device, level differences and the like tend to form readily on the surface due to step bunching, and therefore performing the CMP polishing according to the present invention is very effective. Because the surface of the epitaxial layer is more planar than the surface of the SiC substrate following the slicing process, when the surface of the epitaxial layer is polished by a CMP method, initial surface polishing using a mechanical method can be omitted.

In the present embodiment, double-sided polishing is employed in which the C surface on the back surface of the SiC substrate is polished at the same time as the Si surface of the SiC substrate on which the epitaxial layer has been formed. As a result, the roughness that develops on the C surface side due to the epitaxial growth conditions employed during formation of the epitaxial layer on the Si surface can be removed at the same time as the roughness on the epitaxial layer surface on the Si surface side. In this manner, if the roughness on the C surface can be removed by performing CMP polishing of not only the Si surface of the SiC substrate, but also the C surface, then other effects can also be obtained, including suppression of suction error of the SiC substrate in subsequent evaluation processes, which can lead to improvements in the productivity and the yield.

<Polishing Apparatus>

One example of a polishing apparatus used for performing simultaneous CMP polishing of both the Si surface and the C surface of an SiC substrate in the method for producing an SiC substrate described in the present embodiment is described below.

Figure 1A:
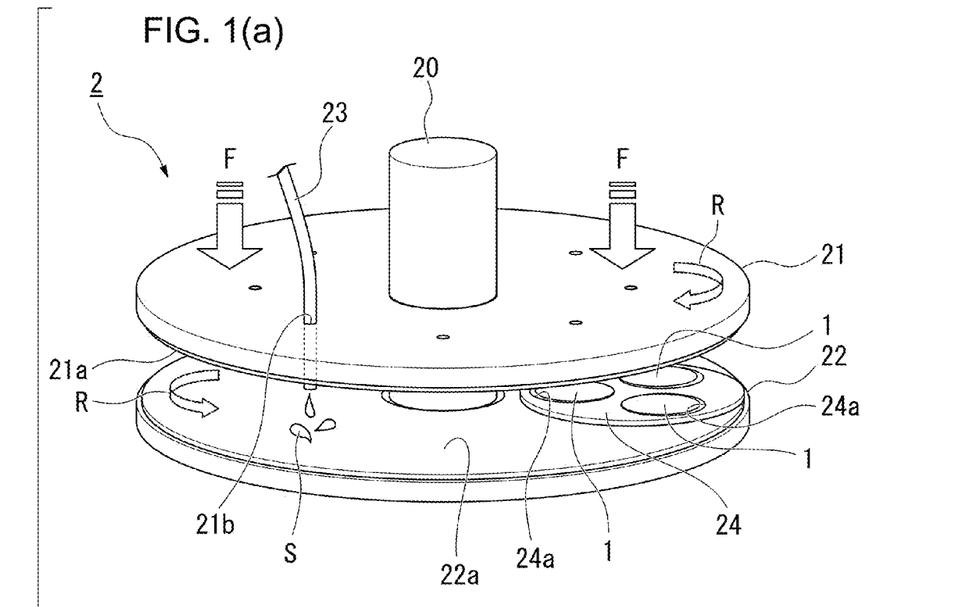
FIG. 1(a) is a perspective view and FIG. 1(b) is a side view illustrating one example of a step of performing double-sided polishing of the SiC substrate using a CMP method.
Figure 1B:
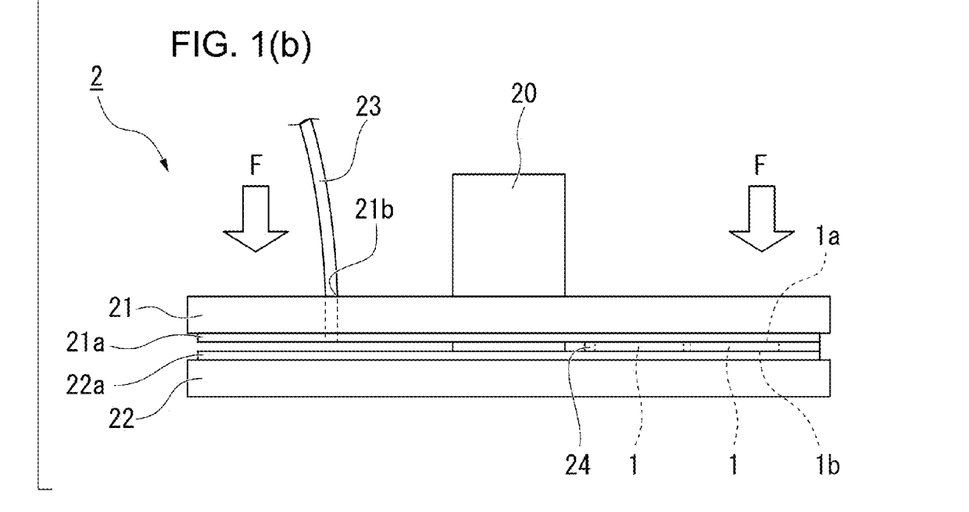

As illustrated in FIG. 1(a) and FIG. 1(b), a polishing apparatus 2 of the present embodiment includes a lower surface plate 22 having an upper surface side which functions as a polishing surface, and an upper surface plate 21, which is supported above the lower surface plate 22 and can be moved freely up and down, and has a lower surface side which functions as a polishing surface. Further, polishing pads 21a and 22a are affixed and secured to the lower surface of the upper surface plate 21 and the upper surface of the lower surface plate 22 respectively, and are used for polishing each of the surfaces of SiC substrates 1. The polishing apparatus 2 is also provided with a slurry tube 23, which supplies a slurry S used for performing the CMP polishing, through a plurality of slurry supply holes 21b that penetrate through the upper surface plate 21, to a space between the upper surface plate 21 and the lower surface plate 22.

The upper surface plate 21 and the lower surface plate 22 are rotated in opposite directions about a support shaft 20 (see the arrows R in FIG. 1(a)), using drive devices not shown in the drawings composed of a motor or the like.

The upper surface plate 21 is able to be rotated freely about the support shaft 20 using a drive device not shown in the drawings installed above the upper surface plate 21. The upper surface plate 21 is able to be moved up and down using, for example, a sliding drive device not shown in the drawings.

The lower surface plate 22 is rotationally driven about the support shaft 20 using a drive device not shown in the drawings installed below the lower surface plate 22. Further, the underside of the lower surface plate 22 is supported, for example, by a ring-shaped bearing or the like that is not shown in the drawings.

A carrier plate 24 having circular holes 24a for holding the SiC substrates 1 that represent the polishing target objects is positioned between the upper surface plate 21 and the lower surface plate 22. This carrier plate 24 is rotationally driven in a planetary motion with free rotation and orbital revolution by an inner pin gear and an outer pin gear which, although not shown in the drawings, are positioned in a center hole of the lower surface plate 22 and have a conventional mechanism. In the example illustrated in FIG. 1(a) and FIG. 1(b), for reasons of ease of illustration and description, only a single carrier plate 24 is shown positioned on the lower surface plate 22, but usually a plurality of these carrier plates 24 are positioned around the circumferential direction of the upper surface plate 21 and the lower surface plate 22. The carrier plate 24 illustrated in the drawings is provided with a total of three circular holes 24a for holding the SiC substrates 1, but the number is not restricted to three, and the number of circular holes 24a may be set as appropriate.

The polishing pads 21a and 22a are affixed to the surfaces of the upper surface plate 21 and the lower surface plate 22 respectively, and are disposed so as to sandwich, from both sides, the SiC substrates 1 held by the carrier plate 24. The polishing pads 21a and 22a rotate together with the upper surface plate 21 and the lower surface plate 22 while being pressed against the SiC substrates from both sides, thereby simultaneously polishing both surfaces of the SiC substrates 1. As a result, the Si surface 1a of each SiC substrate 1 is planarized, and roughness on the Si surface 1a and the C surface 1b is removed. At this time, by positioning the SiC substrates 1 so that the Si surface 1a of each SiC substrate 1 faces the upper surface plate 21 and the C surface 1b faces the lower surface plate 22, an epitaxial layer 11 formed on the Si surface 1a is polished by the polishing pad 21a, and the C surface 1b is polished by the polishing pad 22a.

The types of non-woven cloths and suede materials and the like conventionally used in this field can be used for the polishing pads 21a and 22a.

For example, non-woven cloths such as SUBA400 manufactured by Nitta Haas Incorporated can be used without any particular restrictions as the non-woven cloth or suede material used for the polishing pads 21a and 22a.

The slurry tube 23 supplies the slurry (abrasive) S to the interfaces between the SiC substrates 1 and the polishing pads 21a and 22a, and the tip of the slurry tube 23 is connected to a slurry supply hole 21b provided in the upper surface plate 21. The slurry tube 23 discharges the slurry S, which has been fed from a slurry tank not shown in the drawings using a pump device or the like, from the slurry supply hole 21b to the space between the polishing pads 21a and 22a. As a result, the slurry S is supplied to the interfaces between the SiC substrates 1 and the polishing pads 21a and 22a.

According to the polishing apparatus 2, by supplying the slurry S to the interfaces between the SiC substrates 1 and the polishing pads 21a and 22a while rotating the upper surface plate 21 and the lower surface plate 22 and also rotating the carrier plate 24, both surfaces of the SiC substrates 1 sandwiched between the polishing pads 21a and 22a can be subjected to CMP polishing simultaneously.

As described below in detail, by using the production method of the present embodiment and the polishing apparatus 2 described above, each SiC substrate 1 can be subjected to double-sided polishing of the Si surface 1a and the C surface 1b, using a CMP method, with a C surface/Si surface processing selectivity ratio that is at least as high as the prescribed value, preferably using a potassium permanganate-based slurry containing potassium permanganate as an oxidant. As a result, roughness can be removed from the surface of the epitaxial layer, which is not shown in the drawings but is formed on the Si surface 1a of the SiC substrate 1, the amount of the epitaxial layer removed can be suppressed to a minimum, and roughness on the C surface 1b can also be removed.

<Production Method>

The method for producing the SIC substrate 1 according to the present invention is a method for performing double-sided polishing of the Si surface 1a and the C surface 1b of the SiC substrate 1. Further, the following description illustrates an example in which the polishing apparatus 2 illustrated in FIG. 1(a) and FIG. 1(h) is used to simultaneously polish the Si surface 1a and the C surface 1b of the SiC substrate which has an epitaxial layer not shown in the drawings formed on the Si surface 1a.

The production method according to the present invention is a method for performing double-sided polishing by a CMP method of an SiC substrate 1 having a Si surface 1a and a C surface 1b. In the present embodiment, the method includes at least a CMP step of subjecting the Si surface 1a and the C surface 1b to double-sided polishing with a C surface/Si surface processing selectivity ratio of 3.0 or greater. Further, a potassium permanganate-based slurry containing potassium permanganate as an oxidant and alumina as an abrasive may be used as the CMP slurry.

[Preparation of SiC Substrate]

In the present embodiment, in order to obtain the SiC substrate that represents the polishing target object, an SiC bulk single crystal ingot is first prepared, and the outer periphery of the ingot is ground down to prepare a cylindrically shaped ingot. Subsequently, a wire saw or the like is used to slice the ingot and form a circular disc, and the external periphery of the circular disc is then chamfered to complete preparation of an SiC substrate 1 having a prescribed diameter.

In the present embodiment, there are no particular limitations on the growth method used for the SiC bulk single crystal, the method used for grinding the ingot, or the slicing method, and conventional methods may be employed. Usually, prior to grinding and polishing, the surface of the SiC substrate exists in a state in which fluctuations, undulations and unevenness having a thickness of several tens of μm are present on the substrate surface.

[SiC Substrate Rough Polishing Step]

In the rough polishing step, the Si surface 1*a* and the C surface 1*b* of the SIC substrate 1 are polished using a mechanical polishing method, prior to formation of the epitaxial layer described below.

Specifically, although not shown in detail in the drawings, a mechanical polishing method such as lap polishing is used to remove comparatively large undulations and unevenness due to process distortions or the like from the Si surface 1*a* and the C surface 1*b* of the SIC substrate 1. For example, a method may be employed in which, by using a conventional lap polishing apparatus, holding the SiC substrate on a carrier plate, and supplying a slurry while subjecting the carrier plate to planetary movement while rotating the surface plates, one surface or both surfaces of the SiC substrate can be subjected to simultaneous lap polishing.

In the case where both surfaces of the SiC substrate are polished, first, the SiC substrate is installed and held in a circular hole formed in the carrier plate.

Subsequently, the SiC substrate held by the carrier plate is sandwiched between the upper and lower surface plates, and with a polishing load F applied, the two surface plates are rotated in opposite directions while a slurry containing an abrasive is supplied to the space between the surface plates, thereby polishing both the upper surface and the back surface of the SiC substrate. As a result, the Si surface and the C surface of the SiC substrate are gradually polished, and the protrusions within the residual undulations on each surface are gradually removed. Examples of the abrasive grains used during this step include diamond grains and the like. In the rough polishing step, in the case where only one surface of the SiC surface is polished, the surface on the opposite side from the polishing target surface of the SiC substrate is affixed to the carrier plate with an adhesive or the like, the carrier plate having the SiC substrate affixed thereto and the surface plate are positioned facing each other, and polishing is then performed in the same manner as described above.

The surface of an SiC substrate that has been polished using this type of rough polishing step exists in a state in which large undulations and unevenness due to process distortions or the like have been removed.

In the rough polishing step, the processing pressure used when performing mechanical polishing by lap polishing of the SiC substrate prior to the formation of the epitaxial layer, namely the polishing load F applied when polishing the SiC substrate, is preferably within a range from 10 to 100 g/cm$^2$. This processing pressure corresponds with the polishing rate, and by setting the processing pressure within the above range, a polishing rate can be achieved that enables undulations and unevenness due to process distortions or the like on the SiC substrate surface to be removed within a short period of time. If the processing pressure applied to the SiC substrate exceeds the above range, then it becomes more likely that the SiC substrate, which still has large "thickness variations" and "undulations" following the slicing process, will be exposed to localized forces, which increases the chances of splitting or cracking of the SiC substrate.

Further, the abrasive grains used during the rough polishing step preferably have an average diameter of not more than 10 μm.

In the rough polishing step for the SiC substrate described in the present embodiment, a method in which rough polishing was performed by lap polishing was presented as an example, but a method in which each surface of the SiC substrate 1 is subjected to ultra fine polishing by performing finer polishing using a polish after the lap polishing may also be employed.

Alternatively, in the lap polishing described above, fine polishing can also be performed using a fine diamond slurry such as that used in a polish, having an average particle size of secondary particles of about 0.25 μm (250 nm).

Furthermore, the SiC substrate rough polishing step described above may be performed a plurality of times.

[SiC Substrate Planarization Step]

Next, in a planarization step, the SiC substrate 1 for which the unevenness and parallelism have been adjusted in the rough polishing step described above is subjected to ultra fine polishing (mirror polishing) using a CMP method, thereby planarizing the Si surface 1*a* of the SiC substrate 1. Further the C surface 1*b* of the back surface is also subjected to mirror polishing using a diamond slurry.

Specifically, although not shown in detail in the drawings, the same apparatus as the polishing apparatus 2 illustrated in FIG. 1(*a*) and FIG. 1(*h*) may be used to subject the SiC substrate 1 to double-sided polishing prior to the formation of the epitaxial layer. Alternatively, a conventionally used single-sided polishing apparatus such as that illustrated in FIG. 6 may be used to polish the two surfaces of the SiC substrate 1 in a consecutive manner.

The conditions used when subjecting the SiC substrate 1 to ultra fine polishing by a CMP method prior to the formation of the epitaxial layer may employ the various conditions conventionally employed when polishing an SiC substrate without any particular restrictions.

[Epitaxial Step]

Subsequently, in an epitaxial step, an epitaxial layer is grown on the Si surface 1*a* of the SiC substrate 1 which has been subjected to adjustment of the unevenness and parallelism and then subjected to planarization. In FIG. 1(*a*) and FIG. 1(*b*), this epitaxial layer is not shown.

Specifically, in the epitaxial step, a conventional CVD method or the like is used to deposit an SiC epitaxial layer, used for forming a semiconductor device, on the Si surface 1*a* of the SiC substrate 1.

[CMP Step]

Next, in a CMP step, the SiC substrate 1 having the epitaxial layer, which is not shown in the drawings, formed on the Si surface 1*a* (namely, an SiC wafer) is subjected to polishing using a CMP method.

Specifically, using the type of polishing apparatus 2 illustrated in FIG. 1(*a*) and FIG. 1(*b*), both surfaces of the SiC substrate 1, namely the Si surface 1*a* on which the epitaxial layer has been deposited and the C surface 1*b* on the back surface, are subjected to double-sided polishing by CMP, using a potassium permanganate-based slurry and with a C surface/Si surface processing selectivity ratio of 3.0 or greater.

(Procedure)

First, the SiC substrate 1 that represents the polishing target object is installed and held in a circular hole 24*a* formed in the carrier plate 24 provided in the polishing apparatus 2. At this time, by positioning the substrate 1 so that the Si surface 1a on which the epitaxial layer has been deposited faces upward and the C surface 1b faces downward, the SiC substrate 1 is disposed with the Si surface 1a facing the polishing pad 21a affixed to the upper surface plate 21, and the C' surface 1b facing the polishing pad 22a affixed to the lower surface plate 22. Furthermore, as shown in the drawing example, an SiC substrate 1 is installed and held in each of the three circular holes 24a formed in the carrier plate 24.

Next, by rotating the polishing pad 22a and the lower surface plate 22 at a prescribed rotation rate, and allowing the carrier plate 24 to rotate freely, the carrier plate 24 is rotationally driven in a manner that produces free rotation and orbital revolution while holding the SiC substrate 1. Subsequently, by feeding a slurry (potassium permanganate-based slurry) S described below, which contains potassium permanganate as an oxidant and alumina as an abrasive, through the slurry tube 23, the slurry S is supplied from the slurry supply hole 21b provided in the upper surface plate 21 onto the polishing pad 21a and the carrier plate 24 (SiC substrate 1). The upper surface plate 21 is then moved downward, so that the Si surface 1a on which the epitaxial layer has been deposited contacts the polishing pad 21a, and the C surface 1b contacts the polishing pad 22a. Subsequently, by rotating the upper surface plate 21 and the lower surface plate 22 at prescribed rotation rates, polishing of the Si surface 1a and the C surface 1b is started. At this time, the upper surface plate 21 and the lower surface plate 22 are rotated in opposite directions, as illustrated by the arrows R in FIG. 1(a).

As described above, by supplying the slurry S onto the polishing pad 21a, the carrier plate 24 and the SiC substrate 1, namely the interfaces between the SiC substrate 1 and the polishing pads 21a and 22a, while rotating the upper surface plate 21 and the lower surface plate 22 and also rotating the carrier plate 24, both surfaces of the SiC substrate 1 sandwiched between the polishing pads 21a and 22a are polished simultaneously. In the present embodiment, by performing double-sided polishing of the SiC substrate 1 using the procedure described above, roughness that has developed on the Si surface 1a and the C surface 1b during growth of the epitaxial layer is removed in a single process, and any fine unevenness and the like remaining on the Si surface 1a is planarized.

Subsequently, once the Si surface 1a and the C surface 1b of the SiC substrate 1 have been planarized and mirror polished, the polishing operation is stopped. Specifically, the upper surface plate 21 and the polishing pad 21a are moved upward and away from the polishing pad 22a, the carrier plate 24 and the SiC substrate 1.

Next, rotation of the lower surface plate 22, the polishing pad 21a and the carrier plate 24 is continued, while pure water is used to wash the surface of the SiC substrate 1, and also wash the polishing pad 21a and the carrier plate 24. At this time, the Si surface 1a of the SiC substrate 1 is washed by supplying the pure water directly onto the surface, and the C surface 1b is washed by pure water supplied through the gap between the rotating polishing pad 21a and carrier plate 24, and the SiC substrate 1.

Subsequently, the SIC substrate 1 is removed from the carrier plate 24, and the entire SiC substrate 1 is washed using a conventional cleaning solution to remove any adhered slurry S, and is then dried.

By performing the steps described above, an SiC substrate 1 having a Si surface 1a and a C surface 1b that have been planarized and mirror polished can be produced.

In the present embodiment, a method may also be employed which includes, prior to the CMP step having the procedure described above, a rough polishing step of polishing the Si surface 1a and the C surface 1b of the SiC substrate 1 using a mechanical polishing method.

Following the CMP step described above, further fine polishing may be performed as an additional step.

For example, a case may arise in which the roughness on the C surface 1b is severe, requiring the removal (a polishing amount) of 10 μm or more from the C surface 1b. In this type of case, for example, the C surface 1b may first be subjected to single-sided rough processing, with the CMP double-sided polishing of the SiC substrate 1 under the conditions described above then performed after this rough processing. In the case where the Si surface and the C surface are each subjected to single-side rough processing, when the substrate is mounted to the plate prior to polishing of the C surface 1b, it is usually necessary to first form a protective film covering the Si surface 1a in order to prevent deep scratches in the epitaxial layer that functions as the mounting surface. However, in the case described above, because the Si surface 1a and the C surface 1b are subjected to double-sided polishing in the final step, formation of the above protective film is unnecessary.

(Potassium Permanganate-Based Slurry)

In the present embodiment, the slurry S used in the CMP polishing is preferably a potassium permanganate-based ultra high rate slurry, typically used for polishing the Si surface of SiC substrates, and containing potassium permanganate as an oxidant and alumina as an abrasive. Further, the compositional ratio between the potassium permanganate oxidant and the alumina abrasive in the slurry S is optimized so that the polishing rate of the C surface is higher than that of the Si surface, and the C surface/Si surface processing selectivity ratio is 3.0 or greater.

In the present embodiment, the expression that "the polishing rate of the C surface is higher than that of the Si surface" means that the polishing rate of the C surface is greater than the polishing rate of the Si surface. Further, the expression that "the C surface/Si surface processing selectivity ratio is 3.0 or greater", namely that "the ratio of the polishing rate of the C surface relative to that of the Si surface is 3.0 or greater" means that the polishing rate of the C surface 1b is 3.0 times or more that of the polishing rate of the Si surface 1a.

As described above, the epitaxial layer deposited on the Si surface of the SIC substrate has roughness composed of level differences of about 0.01 μm on the surface of the layer, formed as a result of step bunching and the like that occurs during growth of the layer. Further, when the epitaxial layer is deposited on the Si surface of the SiC substrate, then in a similar manner to that observed for the epitaxial layer of the Si layer, roughness also occurs on the surface of the C surface, due not only to the growing conditions, but also due to material transfer from SiC members, circulation of material gases round to the C surface side, and carbon elimination from the SiC substrate and the like. If the Si surface and C surface of this type of SiC substrate are subjected to double-sided polishing by a CMP method using a colloidal silica-based slurry, then not only is the Si surface processing rate of the slurry containing the colloidal silica inherently slow, but if the Si surface processing rate is optimized, then the processing rate for the C surface may sometimes deteriorate dramatically. As a result, even if the balance between the processing rates of the two surfaces is adjusted, because the absolute values for the rates are low, the processing time required to remove the roughness caused by epitaxial growth tends to lengthen. On the other hand, if, for example, double-sided polishing of the Si surface and the C surface of the SiC substrate is performed using a diamond slurry in order to avoid this type of lengthening of the processing time, then a problem arises in that the selectivity ratio between the two surfaces basically becomes "1", meaning an amount equal to that removed from the C surface is also removed from the epitaxial layer on the Si surface, and if roughness develops on the surface of the epitaxial layer due to the polishing performed using the diamond slurry, then additional processing using a CMP method may then be required.

In the present invention, by using, as the slurry S, a potassium permanganate-based slurry having a high selectivity for the C surface, with a C surface/Si surface processing selectivity ratio of 3.0 or greater, roughness on the surface of the epitaxial layer deposited on the Si surface 1a can be removed while suppressing the amount of the epitaxial layer removed to a minimum. Further, in the present invention, by heavily polishing the C surface 1b on the back side of the substrate at the same time as polishing the Si surface 1a, the roughness on the C surface 1b can be removed effectively. Moreover, in the present invention, because both the Si surface 1a and the C surface 1b can be polished in a single step, the productivity improves. Furthermore, by simultaneously processing both surfaces of the SiC substrate 1 using the method of the present invention, improvements can also be expected in the planarity (GBIR (TTV) and SBIR ($LTV_{max}$)) and therefore an SiC substrate 1 having excellent surface properties can be produced.

In the CMP polishing step for the SiC substrate 1, in addition to setting the C surface/Si surface processing selectivity ratio to a value within the above range, it is also preferable that the polishing rate of the Si surface 1a is within a range from 0.5 to 3.0 (μm/hr), and the polishing rate of the C surface 1b is within a range from 3 to 15 (μm/hr). Provided the polishing rates of the Si surface 1a and the C surface 1b in the CMP polishing using the slurry S satisfy the above ranges, the roughness on the Si surface 1a and the C surface 1b can be removed in a short time, without any lengthening of the processing time, meaning the productivity can be improved.

Further, although there are no particular limitations on the pH of the slurry S, the use of a potassium permanganate-based slurry having a pH, for example, within a range from 2 to 6 is preferable. The reason for this preference is that this type of potassium permanganate-based slurry can easily be controlled to achieve an aforementioned C surface/Si surface processing selectivity ratio of 3.0 or greater.

Furthermore, a slurry containing potassium permanganate as the oxidant, and in which the average particle size of secondary particles formed by aggregation of particles of the alumina abrasive in the slurry is about 0.1 to 0.5 μm can be used favorably as the slurry S. More specifically, a mixed liquid containing an abrasive composed of alumina, potassium permanganate as an oxidant, and also containing nitric acid or the like as a pH modifier can be used as the slurry S.

(Polishing Load)

In the CMP step described in the present embodiment, in those cases when the diameter of the SiC substrate 1 is 4 inches (10.16 cm), the polishing load F with which the polishing pads 21a and 22a are pressed against the SiC substrate 1 is, for example, preferably within a range from 100 to 500 (g/cm²).

In those cases when the diameter of the SiC substrate 1 is 3 inches (7.6 cm), the aforementioned polishing load F is, for example, preferably within a range from 100 to 500 (g/cm²). In the CMP step, by using the slurry S described above, and ensuring that the polishing load F satisfies the above range, the polishing rate of the SiC substrate 1 can be easily controlled at the optimum level.

(Rotation Rates of Polishing Pads and Carrier Plate)

In the CMP step described in the present embodiment, in those cases when the diameter of the SiC substrate 1 is 4 inches, the rotation rate of the polishing pads 21a and 22a may be set to conditions of 10 to 60 rpm. Further, the rotation rate of the carrier plate 24 is not particularly limited, and may be set as appropriate. In the CMP step, by using the slurry S, setting the polishing load F within the range described above, and setting the rotation rates of the polishing pads 21a and 22a within the above range, the polishing rate of the SiC substrate 1 can be easily controlled at the optimum level.

<Actions and Effects>

As described above, the method for producing an SiC substrate 1 according to the present invention employs a method in which an SiC substrate 1 having a Si surface 1a and a C surface 1b is subjected to double-sided polishing of the Si surface 1a and the C surface 1b by a CMP method, using a potassium permanganate-based slurry S, and with a C surface/Si surface processing selectivity ratio that is at least as high as a prescribed value. In this manner, by performing double-sided polishing of the SiC substrate 1 with the CMP polishing process conditions set within appropriate ranges, a simple process can be used to remove the roughness on the surface of the epitaxial layer deposited on the Si surface 1a, suppress the amount of the epitaxial layer removed to a minimum, and also remove roughness from the C surface 1b. Moreover, by processing both surfaces of the SIC substrate 1 simultaneously under the above conditions, improvements can also be expected in the planarity, namely the GBIR (TTV) and the SBIR ($LTV_{max}$). As a result, an SiC substrate 1 which has excellent surface properties and can be used for high-pressure resistant devices can be produced with good productivity and yield.

Although preferred embodiments of the present invention have been described above in detail, the present invention is in no way limited by these specific embodiments, and various alterations and modifications are possible within the scope of present invention disclosed within the claims.

Examples

The effects of the present invention are described below using specific examples, but the present invention is in no way limited by these examples.

Example

In this example, a potassium permanganate-based slurry (DSC-201, manufactured by FUJIMI Incorporated) was used to perform separate CMP polishing of the Si surface and the C surface of an SiC substrate under the conditions described below, and the relationship between the polishing rates of the two surfaces was investigated as a substitute test for the case where CMP double-sided polishing is performed.

In this example, the Si surface and the C surface of the SiC substrate (3 inches, 4H—SiC-4° off substrate) were first subjected to double-sided lap polishing using a diamond slurry with an average particle size of 3 μm, and a rough polishing step was then performed by double-sided polishing using a diamond slurry with an average particle size of 1 μm. The SiC substrate was then subjected to CMP polishing. During this CMP polishing, a slurry was used containing a colloidal silica having an average particle size of secondary particles of about 0.3 (μm) to which $H_2O_2$ had been added as an oxidant. The CMP polishing step of the SiC substrate was conducted under conditions including a polishing processing time of 3.0 (hr), a polishing load of 500 (gf/cm²), a surface plate rotation rate of 60 rpm, and a processing rate for the Si surface of 0.2 (μm/hr) {weight calculation from the density of 3.2 (g/cc)}.

Then, using the potassium permanganate-based slurry described above (a slurry containing alumina as the abrasive), the Si surface and the C surface of the SiC substrate were subjected to separate CMP polishing under the conditions described below, and the polishing rates of the two surfaces were recorded in the graph of FIG. 3. The polishing conditions for the Si surface and the C surface of the SiC substrate were the same. The polishing was performed using three substrates as one set, and the end number shown for each sample number along the horizontal axis of FIG. 3 indicates the substrate number among the set of substrates polished simultaneously. In other words, the three substrates with different end numbers are substrates prepared using the same conditions. On the other hand, Sample-1 and Sample-4 are SiC substrates prepared from mutually different single crystal boules.

In this example, following the CMP polishing, the double-sided polishing was performed and the polishing rates were determined without first depositing an SiC epitaxial layer on the Si surface of the SiC substrate, but the polishing rates for SiC substrates are generally considered to be unaffected by the presence or absence of an epitaxial layer.

(1) SiC substrate (sample): 3 inches, 4H—SiC-4° off substrate, three substrates per set {no epitaxial layer on Si surface}

(2) CMP polishing conditions
  A. Polishing apparatus: manufactured by Fujikoshi Machinery Corp.
  B. Processing time: 60 min
  C. CMP slurry: alumina+potassium permanganate+nitric acid (pH: 3)
  D. Slurry amount, flow rate: at least 7,000 g, 100 (ml/min)
  E. Slurry supply method: free flow
  F. CMP polishing load: 280 gf/cm$^2$
  G. Surface plate rotation rate: 60 rpm As illustrated in the graph of FIG. 3, when the SiC substrates were polished using the potassium permanganate-based slurry (the alumina abrasive slurry) under the same polishing conditions for both surfaces, the polishing rate of the Si surface was 1.31 to 1.98 (μm/hr), whereas the polishing rate of the C surface was a much higher value of 6.73 to 8.24 (μm/hr), yielding a high selectivity ratio averaging 4.7.

Even when SiC substrates fabricated from different single crystal bottles were used, similar effects were obtained, and similar effects were also obtained for all three SiC substrates in each set. In other words, under the above processing conditions, the ratio between the polishing rate of the Si surface and the polishing rate of the C surface shows little variation within a processing batch or between processing batches, and differences due to SiC substrate production history tend not to occur.

As described above, the roughness on the surface of the epitaxial layer on the Si surface is mainly roughness having a height of about 0.01 μm caused by step bunching, and therefore it is clear that provided the polishing rates are set within the ranges described above, the roughness can be almost completely removed using a short processing time in the order of minutes, while maintaining the thickness of the epitaxial layer.

Figure 3:
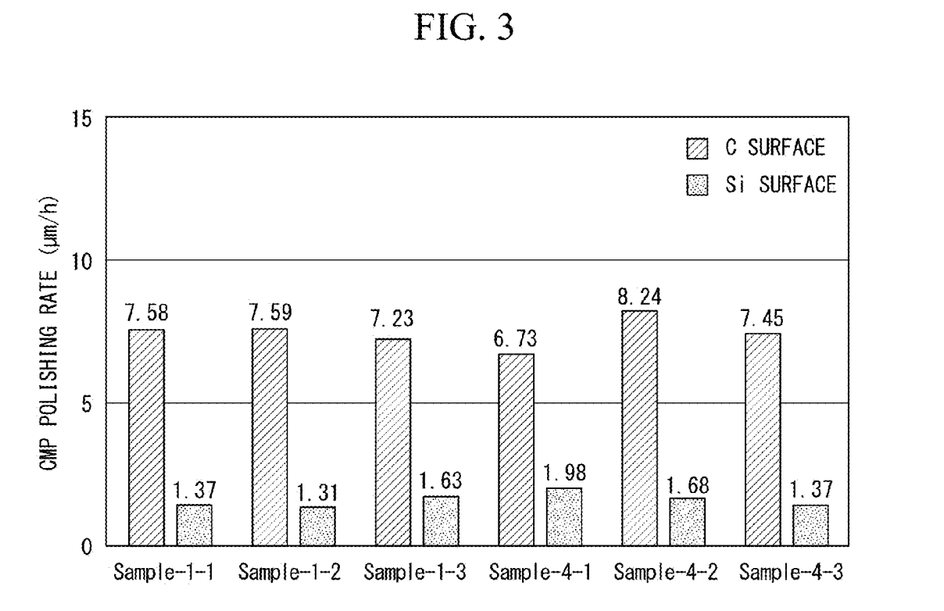
FIG. 3 is a diagram schematically describing the method for producing an SiC substrate according to an embodiment of the present invention, and is a graph illustrating the polishing rates of the Si surface and the C surface upon double-sided polishing of the SiC substrate for a prescribed time by a CMP method using a potassium permanganate-based slurry.

On the other hand, the roughness that develops on the rear side C surface during the epitaxial growth is often sufficient to cause clouding of the substrate surface (see the microscope photograph of FIG. 7(b)), but as shown in the graph of FIG. 3, the polishing rate for the C surface is extremely high. As a result, it is clear that even when the surface polishing process is set to a short time in order to maintain the thickness of the epitaxial layer on the Si surface, the roughness on the C surface can still be almost completely removed.

Figure 4A:
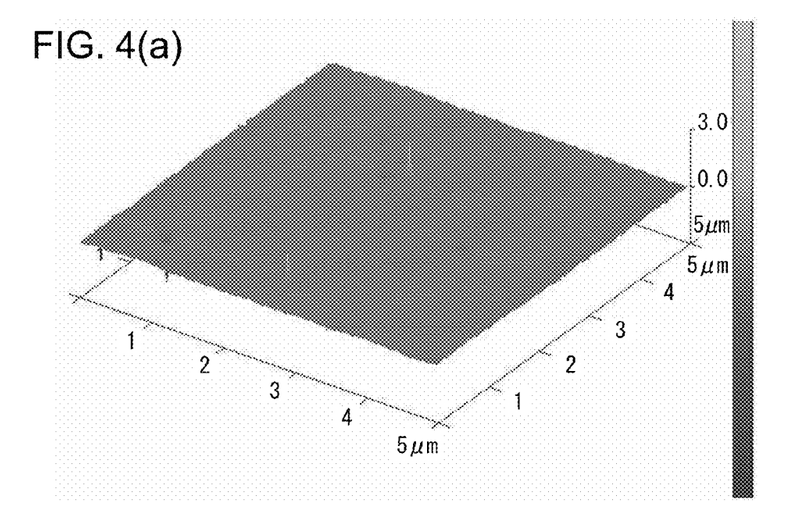
FIG. 4(a) is an AFM measurement image of the Si surface and FIG. 4(b) is an AFM measurement image of the C surface following CMP polishing of the SiC substrate with a potassium permanganate-based slurry.
Figure 4B:
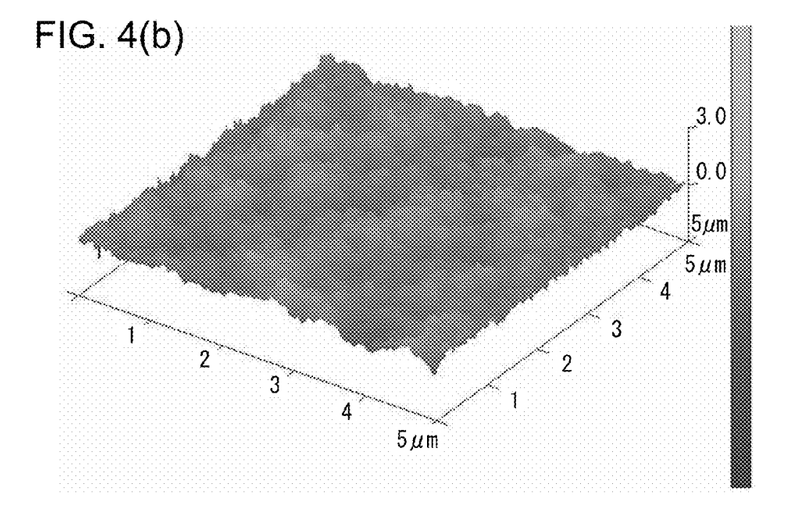

Further, in the present example, the surface roughness of the SiC substrate following the CMP polishing was confirmed by AFM (5 μm square field of view) for both the Si surface and the C surface, and FIG. 4(a) shows the AFM measurement image of the Si surface and FIG. 4(b) shows the AFM measurement image of the C surface.

The results revealed a surface roughness Ra for the Si surface of 0.056 (nm), which is slightly rougher than the Ra value of 0.03 to 0.05 (nm) observed when a typical colloidal silica slurry is used, but is significantly improved compared with an epitaxial surface on which typical step bunching has occurred.

On the other hand, the surface roughness Ra for the C surface was 0.2 (nm), which although being rougher than that of the Si surface, represents a significant improvement in planarity compared with the surface roughness Ra of 1 (nm) typically observed when polishing is performed using a diamond slurry having an average particle size of about 1 μm.

This type of difference between the surface roughness values for the Si surface and the C surface is thought to be due to the fact that on the C surface where the processing rate is higher, the mechanical action is the more active action among the chemical action and the mechanical action generated by the CMP polishing, meaning that although the polishing rate is higher, the surface is slightly rougher than the Si surface.

Test Example

A test example conducted by the inventors of the present invention to substantiate the method for producing an SiC substrate according to the present invention is described below.

Figure 2:
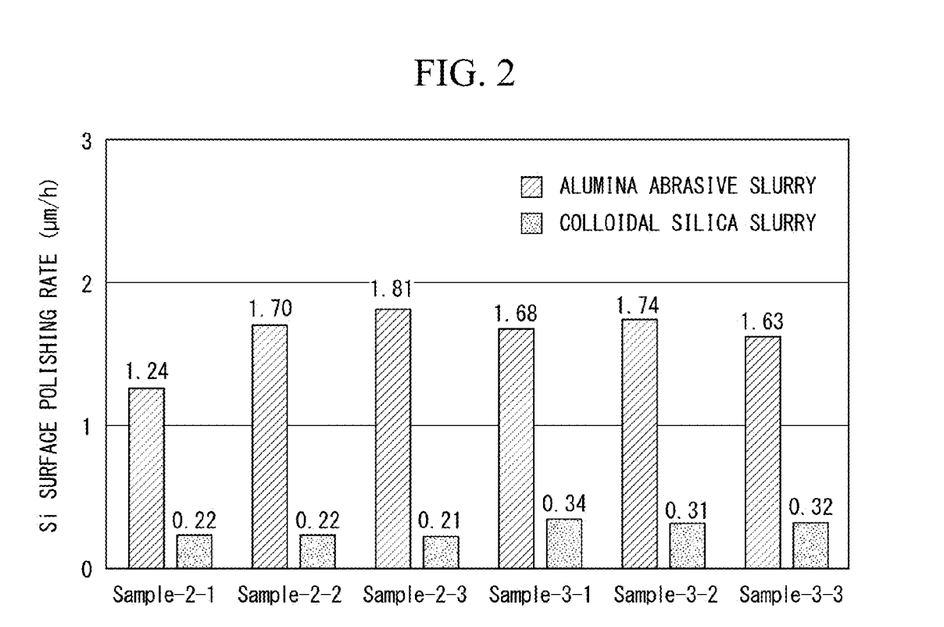
FIG. 2 is a diagram schematically describing the method for producing an SiC substrate according to an embodiment of the present invention, and is a graph illustrating the polishing rate when the Si surface of the SiC substrate is polished for a prescribed time by a CMP method, using either a potassium permanganate-based slurry or a colloidal silica-based slurry.

In this test example, the potassium permanganate-based slurry described above (the slurry containing alumina as an abrasive) and a commercially available colloidal silica slurry were used to perform CMP polishing of the Si surface of SiC substrates under the same conditions as those described above, and the polishing rates observed were recorded in the graph of FIG. 2. The polishing was performed using three substrates as one set, and the end number shown for each sample number along the horizontal axis of FIG. 2 indicates the substrate number among the set of substrates polished simultaneously. In other words, the three substrates with different end numbers are substrates prepared using the same conditions. On the other hand, Sample-2 and Sample-3 are SiC substrates prepared from mutually different single crystal boules.

As illustrated in FIG. 2, when CMP polishing of the SiC substrates was performed using the colloidal silica slurry, the polishing rate of the Si surface was about 0.21 to 0.34 (μm/hr). On the other hand, when CMP polishing of the SiC substrates was performed using the potassium permanganate-based slurry (the alumina abrasive slurry), the polishing rate of the Si surface was from 1.24 to 1.81 (μm/hr), and it was clear that a high rate of at least 1 (μm/hr) that was several times the rate observed when using the colloidal silica-based slurry was able to be obtained.

Further, in relation to the polishing rate, similar effects were obtained even if SiC substrates fabricated from different single crystal boules were used, and similar effects are also obtained for all three SiC substrates in each set. In other words, it was clear that even if the performance of the SiC substrates varied by a margin of error within typical production ranges, similar effects could still be obtained regardless of the processing batch.

Based on the results of the types of examples described above, it is evident that by employing the method for producing an SiC substrate according to the present invention, a simple process using CMP double-sided polishing can be used to remove the roughness on the surface of the epitaxial layer deposited on the Si surface, suppress the amount of the epitaxial layer removed to a minimum, and also remove roughness from the C surface, and therefore an SiC substrate 1 which has excellent surface properties and can be used for high-pressure resistant devices can be produced with good productivity and yield.

INDUSTRIAL APPLICABILITY

The method for producing an SiC substrate according to the present invention enables an SiC substrate having excellent surface properties and an epitaxial layer with a large layer thickness to be produced with good productivity and yield, and is therefore particularly ideal for producing an SiC substrate that can be used in high-pressure resistant devices and the like.

DESCRIPTION OF THE REFERENCE SIGNS

1: SiC substrate
1*a*: Si surface (surface of epitaxial layer)
1*b*: C surface
2: Production apparatus
21: Upper surface plate
21*b*: Slurry supply hole
22: Lower surface plate
21*a*, 22*a*: Polishing pad
23: Slurry tube
20: Support shaft
24: Carrier plate
24*a*: Circular hole
S: Slurry
F: Polishing load

The invention claimed is:

1. A method for producing an SiC substrate that includes a step of polishing surfaces of the SiC substrate, wherein the method comprises at least:
   a CMP step of subjecting both a Si surface and a C surface of the SiC substrate to double-sided polishing using a CMP (Chemical Mechanical Polishing) method with a C surface/Si surface processing selectivity ratio of 3.0 or greater.

2. The method for producing an SiC substrate according to claim 1, wherein the SiC substrate is an SiC substrate prepared by stacking an epitaxial layer on the Si surface side of the substrate.

3. The method for producing an SiC substrate according to claim 1, wherein the CMP step uses a potassium permanganate-based slurry comprising potassium permanganate as an oxidant and having a pH of 2 to 6.

4. The method for producing an SiC substrate according to claim 3, wherein the CMP step uses, as the potassium permanganate-based slurry, a slurry comprising alumina as an abrasive.

5. The method for producing an SiC substrate according to claim 1, wherein in the CMP step, a polishing load with which a polishing pad is pressed against the SiC substrate is within a range from 100 to 500 ($g/cm^2$).

6. The method for producing an SiC substrate according to claim 1, wherein in the CMP step, a polishing rate of the Si surface of the SiC substrate is from 0.5 to 3.0 ($\mu m/hr$), and a polishing rate of the C surface is from 3 to 15 ($\mu m/hr$).

7. The method for producing an SiC substrate according to claim 1, further comprising, prior to the CMP step, a rough polishing step of polishing the Si surface and the C surface of the SiC substrate using a mechanical polishing method.

* * * * *